(12) United States Patent
Varjo

(10) Patent No.: US 7,443,165 B2
(45) Date of Patent: Oct. 28, 2008

(54) WIRELESS MR RECEIVING COIL SYSTEM

(75) Inventor: Tomi E. K. Varjo, Espoo (FI)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 11/571,904

(22) PCT Filed: Jun. 23, 2005

(86) PCT No.: PCT/IB2005/052080

§ 371 (c)(1),
(2), (4) Date: Jan. 10, 2007

(87) PCT Pub. No.: WO2006/008665

PCT Pub. Date: Jan. 26, 2006

(65) Prior Publication Data

US 2007/0182409 A1    Aug. 9, 2007

Related U.S. Application Data

(60) Provisional application No. 60/588,284, filed on Jul. 15, 2004.

(51) Int. Cl.
*G01V 3/00* (2006.01)
(52) U.S. Cl. ..................................... 324/322
(58) Field of Classification Search ......... 324/300–322; 600/410–435
See application file for complete search history.

(56) References Cited

U.S. PATENT DOCUMENTS

| | | | |
|---|---|---|---|
| 4,981,137 A | 1/1991 | Kondo et al. | |
| 5,134,373 A | 7/1992 | Tsuruno et al. | |
| 5,245,288 A * | 9/1993 | Leussler | 324/322 |
| 5,384,536 A * | 1/1995 | Murakami et al. | 324/309 |
| 5,412,419 A | 5/1995 | Ziarati | |
| 5,432,544 A | 7/1995 | Ziarati | |
| 5,491,415 A | 2/1996 | Holmes et al. | |
| 5,666,055 A | 9/1997 | Jones et al. | |
| 6,198,285 B1 | 3/2001 | Kormos et al. | |
| 6,475,146 B1 | 11/2002 | Frelburger et al. | |
| 6,624,777 B2 | 9/2003 | Miyano | |
| 6,961,604 B1 * | 11/2005 | Vahasalo et al. | 600/410 |
| 7,309,989 B2 * | 12/2007 | Boskamp et al. | 324/322 |
| 2002/0179092 A1 | 12/2002 | Swennen et al. | |

FOREIGN PATENT DOCUMENTS

| EP | 0 498 996 A1 | 8/1992 |
|---|---|---|
| WO | 03032002 A1 | 4/2003 |

* cited by examiner

*Primary Examiner*—Dixomara Vargas

(57) ABSTRACT

A magnetic resonance imaging system includes a local coil assembly (30) which is disposed in an examination region (14) electrically isolated from the scanner. The coil assembly includes a plurality of coils (34) each with an electronics module. The received resonance signals that are digitized by an analog to digital converter (92) clocked by timing signals received optically from a scan controller (58). The digital resonance signals are converted (74) into optical signals. The optical signals from each of the plurality of coil modules (36) are communicated to a corresponding optical receiver/transmitter (100₁, . . . , 100N) located on the scanner which converts the optical signals to electrical signals for transmission to a reconstruction processor (50) and the electrical signals from the scan controller (58) to optical control and timing signals for transmission to the corresponding coil module.

22 Claims, 2 Drawing Sheets

WIRELESS MR RECEIVING COIL SYSTEM

CROSS REFERENCE TO RELATED APPLICATIONS

This application claims the benefit of U.S. provisional application Ser. No. 60/588,284 filed Jul. 15, 2004, which is incorporated herein by reference.

The present invention relates to the magnetic resonance arts. It finds particular application in conjunction with magnetic resonance imaging and will be described with particular reference thereto. However, it is to be appreciated that the present invention may also find application in conjunction with magnetic resonance spectroscopy and the like.

Magnetic resonance imaging systems typically include a whole-body radio frequency coil for exciting magnetic resonance within a subject and receiving signals from the induced magnetic resonance. The resonance signals being orders of magnitude smaller than the excitation signal, it is often advantageous to place a local receive coil as close to the source of the resonance signals as possible. In other applications, it is advantageous to place the excitation radio frequency coil as close to a region of interest as possible.

To this end, local RF coils, such as head coils and surface coils, have been developed which are positioned touching or closely adjacent to the subject. The local coils typically include a shielded electrical cable which carries resonance signals received by the coil to the associated electronics in the scanner. Often, the shielded cable also carries electrical power to a preamplifier or other electrical circuitry located on the receive coil. When the local coil also functions as a transmit coil, the cable provides transmit power to the local coil.

When the receive coil is electrically connected to the system electronics, the coils are not electrically floating. This can cause additional loading to the coils that reduce the signal to noise ratio. Further, the transmitted RF fields are disturbed when the signal couples to the shielded coil cables. This may also cause a potential risk to patients. Specifically, the transmitted RF field can induce currents in the cable which can flow through the shields and grounds of the coils, creating heat which can burn the patient.

One approach to minimizing these problems with head coils included designing the head coil and patient support for a mating, grounded interengagement including an electrical plug-in socket arrangement. In this manner, lead lengths could be minimized and isolated from the patient. However, this approach only addressed some of the problems and is generally not applicable to surface coils. Others have proposed communicating with the coil via RF signals. At kilohertz frequencies, the bandwidth carrying capacity is limited. At megahertz frequencies, the RF signal can interfere with the magnetic resonance imaging. Signals in the gigahertz range are distinctly removed from the magnetic resonance frequencies, but have other drawbacks. Infrared signals have been used in the magnetic resonance imaging suite for TV remote-type controllers, but then limited bandwidth has restricted their applications.

The present application contemplates a new and improved magnetic resonance system which overcomes the above-referenced problems and others.

In accordance with one aspect of the present invention, a magnetic resonance system includes a magnet that provides a main magnetic field through an examination region, a scan controller that includes magnetic resonance signal acquisition, and a processor that processes received resonance signals. A radio frequency coil assembly is disposed in the main field in the examination region to at least receive the magnetic resonance signals. The radio frequency coil assembly is electrically isolated from the scan controller and the processor. A wireless communication system communicates resonance signals from the RF coil assembly to the processor and communicates control and timing signals from the scan controller to the RF coil assembly.

In accordance with another aspect of the present invention, a magnetic resonance method is provided. A radio frequency coil assembly is positioned in an imaging region of a magnetic resonance scanner such that the coil assembly is electrically isolated from the magnetic resonance scanner. Resonance data from the coil assembly is communicated to the scanner optically and timing and control signals are communicated from the scanner to the coil assembly optically.

One advantage of the present invention in resides electrically floating RF coils.

Another advantage is that it provides for two-way communication.

Another advantage of the present invention is that transmit and receive local coils can be electrically floating.

Other advantages reside in reduced complexity and cost.

Still further advantages and benefits of the present invention will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

Figure 1:
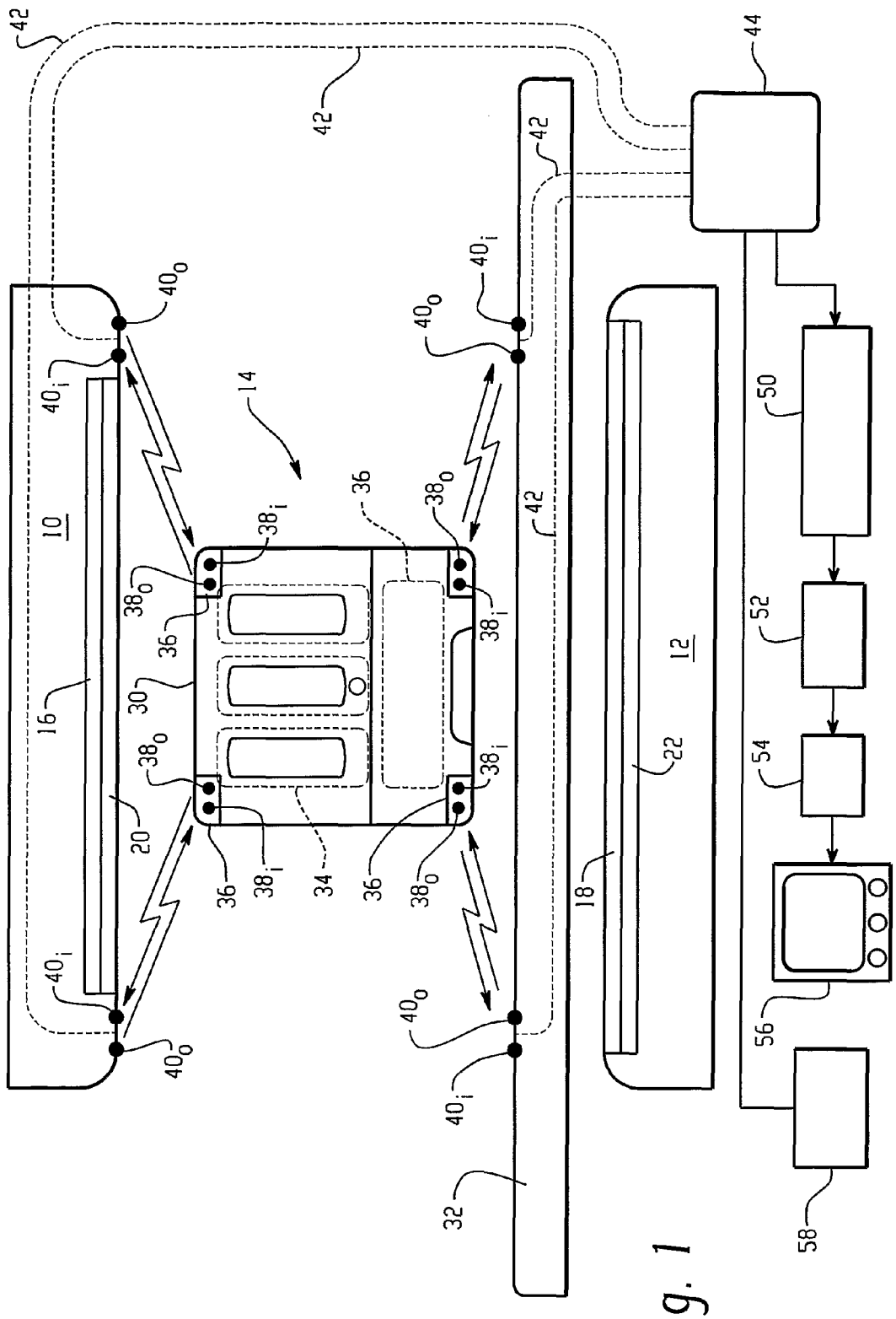
FIG. 1 is a diagrammatic illustration of a magnetic resonance imaging system in accordance with the present invention.

With reference to FIG. 1, a magnetic resonance imaging system includes a main magnet, an upper magnet pole 10 and a lower magnet pole 12 in the illustrated open or vertical field magnetic system, for generating a temporally constant $B_0$ magnetic field through an examination region 14. Of course, the present invention is also applicable to bore-type magnets with annular coils. The magnetic resonance imaging system further includes gradient coils 16, 18 for generating magnetic field gradients across the $B_0$ field. Whole-body RF coils 20, 22 generate $B_1$ RF excitation pulses and can receive the resultant magnetic resonance signals.

A local coil assembly 30, a head coil assembly in the illustrated embodiment, is selectively movable from a docking station which includes a battery charging unit to a patient support 32 or the subject itself for surface coils. This enables the local coil assembly 30 to be positioned in the imaging region 14 on an as needed basis. The local coil assembly preferably includes a plurality of individual RE coil elements 34, which are shaped and oriented to be sensitive to induced resonance signals. The plurality of coils may include a plurality of coils which make up a phased-array coil assembly, a plurality of coils which constitute a SENSE coil assembly, a loop coil, a saddle coil, and other more complex coil designs and combinations. The plurality of RF coils is connected with a plurality of infrared (IR) transmit/receive modules 36. Each of the modules has an optical output lens $38_o$ and an optical input lens $38_i$. As is explained in greater detail below, received data is transmitted from each module through the optical output lens $38_o$ and timing and control information is received by each module through the optical input lens $38_i$.

The optical input and output lenses of each of the modules is aimed and screened such that each can communicate with a single, corresponding pair of scanner optical output and input lens $40_o$ and $40_i$. Each of the scanner optical input and output lens pairs is connected by an optic fiber cable 42 to a scanner communications module 44, typically located within the Faraday shielded scanner room. However, the optical fibers may carry the signals to the exterior of the shielded room.

Data signals received from the local coil are communicated to a console which includes a reconstruction processor 50 which reconstructs the received data into diagnostic images that are stored in an image memory 52. A video processor 54 converts the images into a selected form and format for display on a video monitor 56. A scan controller 58 controls the application and timing of RF and gradient coil pulses by the whole-body gradient coils 16, 18 and RF coils 20, 22. The scan controller also communicates through the system module 44 and the IR channels with the local coil 30 to convey timing information, switch the coils between transmit and receive modes, cause local coils that are used to transmit $B_1$ RF fields to transmit, and the like.

Figure 2:
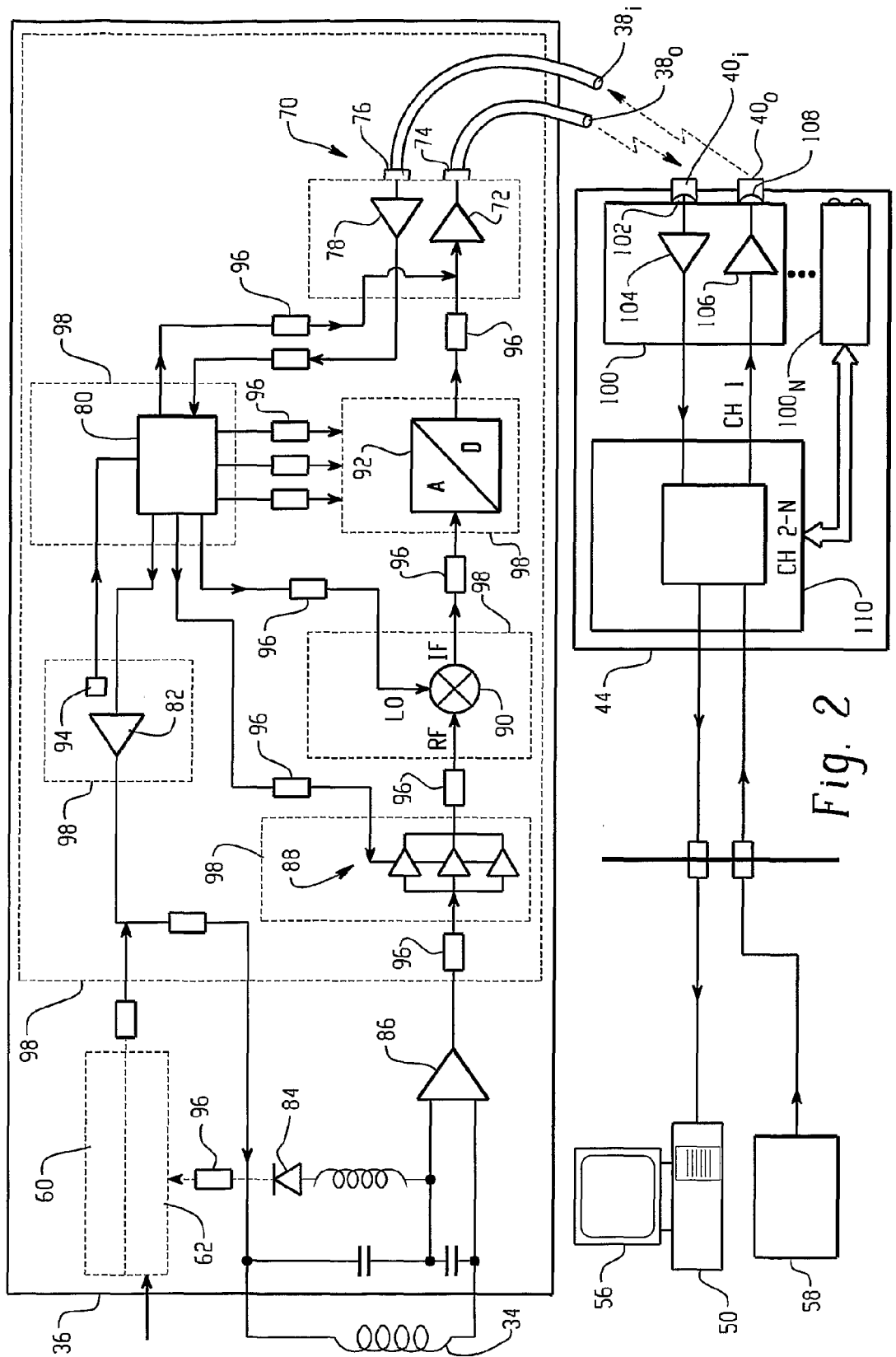
FIG. 2 is a circuit diagram for one of the IR communication channels of FIG. 1.

Looking now to FIG. 2, each of the coil mounted modules 36 includes a rechargeable power supply 60, such as a rechargeable battery, a large capacitor, or other device capable of storing and supplying energy. Preferably, each coil module includes its own power supply, although a central coil mounted power supply or power sharing among module power supplies is contemplated. The power supply is associated with a charging circuit 62. In the preferred embodiment, the charging circuit connects with a source of power when the coil is docked in its storage rack. Alternately, the charging circuit can receive electric power inductively, such as power passed from the whole-body RF coils 20, 22 to the coil windings 34.

The power supply supplies the operating power for an infrared module driver/receiver amplifier and associated circuitry 70. The module 70 includes an amplifier 72 which amplifies outgoing signals and an infrared LED 74 which converts the electrical signals to optical signals. The output lens 38 can be connected directly with the LED 74 or can be interconnected with it by fiber optics. Analogously, the module includes a silicon PIN diode 76 which converts optical signals received at the input lens $38_i$ into electrical signals which are amplified by an amplifier 78. The input signals include clock signals to clock circuits of the coil module to the system clock and command signals for switching the coil 30 among various available operating modes.

The input information is conveyed from the driver/receiver amplify to a control logic circuit 80 which implements the instructions. Specifically, the control logic circuit controls a driver circuit 82 which switches 84 the element 34 of the receive coil between transmit and receive modes. In the illustrated embodiment, the coil segment 34 is detuned during transmit such that it is relatively insensitive to signals of the frequency of the excitation pulse. In an alternate embodiment in which the local coil 30 is used as both a transmit and receive coil, the driver circuit 82 applies power from the power supply 60 to create an RF excitation pulse with the timing and characteristics set by the control logic circuit 80 in accordance with the timing and instructions received from the scan electronics 58.

During the receive mode, resonance signals received by the coil segment 34 are amplified 86 and again by a switchable preamplifier 88. The amplifier stage 88 is switchable among a selection of amplifiers by the control logic circuit 80 in accordance with the selected imaging technique to maximize the dynamic range.

An RF mixer 90 transforms the resonance signal to a lower frequency by mixing the resonance signal with a low frequency signal supplied by the control logic circuit 80 in accordance with instructions received from the scan electronics. The mixing provides a lower frequency output resonance signal, e.g., a 250 kilohertz signal, which is digitized by an analog-to-digital converter 92 that digitizes the signal. The digitization process is clocked and synchronized by the control logic circuit 80 in accordance with the clocking signals from the scan electronics such that the digital signals are synchronized with the signals from other elements of the coil assembly and with other system operations. The digital resonance signal is conveyed to the amplifier 72 for communication to the system electronics.

A coil condition sensor 94, such as a temperature sensor monitors temperature, other environmental conditions, and self-diagnostic and other information sensed on the local coil assembly 30. The control logic circuit 80 causes the sensed conditions, on command, to be sent to the amplifier 72 for communication to the scan electronics. To minimize electrical noise in each part of the module, the parts are separated by filters 96 and are each (except for the coil element) housed in a Faraday cage. Multilayer printed circuit board design is preferably used to minimize noise.

The communications to and from each receiver module are processed by one or more system modules 44. The system module includes an IR driver/receiver amplifier assembly $100_1, \ldots 100_N$ for each of N channels, each communicating with a coil module 36. Each assembly 100 includes a silicon PIN diode or other electronic device 102 for converting the infrared signals received at the input lens $40_i$ into an electrical signal. The electrical signal is amplified by an amplifier 104. Analogously, an amplifier 106 amplifies control and timing signals from the scan electronics 58 which are converted to infrared light by an LED 108 or other electro-optical conversion device.

A controller/data combiner 110 combines or multiplexes the amplified digital input signals from the amplifiers 104 associated with each of the coil modules 36 and conveys them to the reconstruction processor 50. Analogously, the controller/combiner 110 distributes the low frequency carrier signal for the RF mixer, timing information, and other control signals to the amplifiers 106 corresponding to each of the coil modules 36.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A magnetic resonance system comprising:
   a magnet that provides a main magnetic field through an examination region;
   a scan controller that controls magnetic resonance signal acquisition;
   a processor that processes resonance signals;
   a radio frequency coil assembly disposed in the main magnetic field in the examination region to at least receive magnetic resonance signals, the radio frequency coil assembly being electrically isolated from the processor and the scan controller; and
   an optical wireless communication system comprised of an optical transmit/receive module, an optical output lens, and an optical input lens, which uses light waves to communicate resonance signals from the RF coil assembly to the processor and communicates control and timing signals from the scan controller to the RF coil assembly.

2. The apparatus according to claim 1, wherein the RF coil assembly includes:
a plurality of RF coil elements, the wireless communication system including a plurality of coil assembly mounted transmit/receive modules, each module connected with one of the RF coil elements.

3. The apparatus according to claim 1, wherein the RF coil assembly includes a plurality of coil mounted transmit/receive modules, each of the modules including:
a means for converting optical signals to electrical signals; and,
a means for converting electrical signals to optical signals.

4. The apparatus according to claim 3, further including a plurality of scanner mounted_receiver/sending modules connected with the scan controller and the reconstruction processor, each of the scanner mounted transmit/receive modules including:
a means for converting optical signals from the electrical to optical signal converting means of a corresponding one of the coil mounted transmit/receive modules to electrical signals for communication to the reconstruction processor; and
a means for converting electrical timing and control signals from the scan controller to optical signals for transmission to the optical to electrical signal converting means of the corresponding one of the coil modules.

5. The apparatus according to claim 4, further including a controller/combiner means for distributing the control and timing signals from the scan controller to send/receive modules corresponding to each of the plurality of scanner mounted transmit/receive modules and for communicating electrical resonance signals from each of the plurality of scanner mounted transmit/receive modules to the processor.

6. The apparatus according to claim 4, wherein each of the coil modules includes:
a rechargeable power supply; and
a recharging circuit.

7. The apparatus according to claim 6, wherein each of the coil modules includes a controller which receives the electrical timing and control signals from the coil mounted optical-to-electrical converting means.

8. The apparatus according to claim 7, wherein each of the coil modules further includes:
an analog-to-digital converter which is clocked by the control means in accordance with the timing signals received from the scan controller via the scanner and coil mounted transmit/receive modules to convert electrical resonance signals received by the coil assembly from analog to digital, the analog to digital converter being connected to the electrical-to-optical converter means.

9. The apparatus according to claim 8, wherein each of the coil modules further includes:
an RF mixer for mixing the analog resonance signals from the coil with a low frequency carrier signal received from the control means, an output of the RF mixer being connected with an input of the analog-to-digital converter.

10. The apparatus according to claim 7, further including:
a means for switching the coil among a plurality of modes.

11. The apparatus according to claim 7, further including:
a sensing means for sensing conditions on the coil assembly.

12. The apparatus according to claim 7, wherein each of the coil modules includes:
a plurality of components which are Faraday-shielded collectively and from each other.

13. The apparatus according to claim 12, further including:
filter circuits disposed between each of the Faraday-shielded electrical components to reduce noise.

14. The apparatus according to claim 4, further including:
an image memory in which the image representations reconstructed from the magnetic resonance data into an image representation by the processor are stored; and
a means for converting selected image representations into a human-readable format.

15. A magnetic resonance method comprising:
positioning a radio frequency coil assembly in an imaging region of a magnetic resonance scanner such that the coil assembly is electrically isolated from the magnetic resonance scanner, the coil assembly including a plurality of coils each associated with an electric module;
converting electrical magnetic resonance signals from the radio frequency coil assembly to optical magnetic resonance signals using LEDs in the electric modules;
separately communicating the optical resonance signals from the electric modules of the coil assembly to the scanner optically;
separately communicating control and timing signals from the scanner to the electric modules optically; and
reconstructing the magnetic resonance signals into an image representation.

16. The method according to claim 15, further including:
recharging a battery in each of the modules from one of a battery charger located in a coil storage rack and from RF signals received by the coil assembly from a whole-body RF coil of the scanner.

17. The method according to claim 15, further including:
digitizing the resonance signals prior to converting the resonance signals to signals for optical communication to the scanner.

18. The method according to claim 17, further including:
clocking the digitizing in accordance with the control and timing signals.

19. The method according to claim 15, further including:
switching the coil between a plurality of modes in accordance with the control and timing signals.

20. The method according to claim 15, further including:
sensing conditions at each of the modules and communicating the sensed conditions optically to the scanner.

21. The method according to claim 15, wherein the coil assembly is a parallel imaging coil in which the plurality of coils function concurrently and separately, the coil electric modules each digitize resonance signals received by the corresponding coil and optically communicating in parallel optically digitize resonance signals to the scanner and each coil electric module receives optical digital timing and control signals from the scanner.

22. A magnetic resonance system comprising:
a magnet that provides a main magnetic field through an examination region;
a scan controller that controls magnetic resonance signal acquisition;
a processor that processes resonance signals;
an RF coil assembly including a plurality of coils switchable to each of a plurality of modes, the RF coil assembly being disposed in the main magnetic field in the examination region to at least receive magnetic resonance signals, the radio frequency coil assembly being electrically isolated from the processor and the scan controller; and an optical wireless communication system comprised of infrared LEDs which converts electrical signals to optical signals, wherein the wireless communication system optically communicates resonance signals from the RF coil assembly to the processor, and optically communicates control signals from the processor to the RF coil assembly for switching the coils among the operating modes, and optically communicates timing signals from the processor to the RF coil assembly to the clock circuits of the coils, the optical communicating being in parallel.

* * * * *